(12) United States Patent
Lei et al.

(10) Patent No.: US 10,311,165 B2
(45) Date of Patent: Jun. 4, 2019

(54) GUIDING PATTERNS OPTIMIZATION FOR DIRECTED SELF-ASSEMBLY

(71) Applicant: Mentor Graphics Corporation, Wilsonville, OR (US)

(72) Inventors: Junjiang Lei, Fremont, CA (US); Le Hong, Vacaville, CA (US); Yuansheng Ma, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 502 days.

(21) Appl. No.: 15/084,993

(22) Filed: Mar. 30, 2016

(65) Prior Publication Data

US 2016/0292309 A1    Oct. 6, 2016

Related U.S. Application Data

(60) Provisional application No. 62/140,363, filed on Mar. 30, 2015.

(51) Int. Cl.
*G06G 7/48* (2006.01)
*G06F 17/50* (2006.01)
(Continued)

(52) U.S. Cl.
CPC ............. *G06F 17/50* (2013.01); *G03F 1/00* (2013.01); *G03F 1/36* (2013.01); *G03F 1/70* (2013.01); *G03F 1/72* (2013.01); *G03F 7/0002* (2013.01)

(58) Field of Classification Search
None
See application file for complete search history.

(56) References Cited

U.S. PATENT DOCUMENTS 9,032,357 B1    5/2015   Robles et al.
9,836,556 B2 *  12/2017  Lei ........................... G03F 1/36
(Continued)

OTHER PUBLICATIONS

Ma, Yuansheng, et al. "Directed self-assembly (DSA) graphoepitaxy template generation with immersion lithography." Alternative Lithographic Technologies VII. vol. 9423. International Society for Optics and Photonics, 2015. (Year: 2015).*

(Continued)

*Primary Examiner* — Aniss Chad
*Assistant Examiner* — Nithya J. Moll (57) ABSTRACT

Aspects of the disclosed technology relate to techniques of generating guiding patterns for via-type features. An initial guiding pattern characterized by a plurality of guiding pattern parameters is constructed for two or more via-type features in a layout design based on target values of location and size parameters for the two or more via-type features. Predicted values of the location and size parameters are then extracted from the initial guiding pattern based on simulations or correlation information between the plurality of guiding pattern parameters and the location and size parameters. Based on the predicted values of the location and size parameters, the target values of location and size parameters and the correlation information, a modified guiding pattern is determined by adjusting one or more parameters of the plurality of guiding pattern parameters. The extraction and determination operations may be iterated.

20 Claims, 10 Drawing Sheets

(51) Int. Cl.
G03F 1/36 (2012.01)
G03F 1/70 (2012.01)
G03F 1/72 (2012.01)
G03F 7/00 (2006.01)
G03F 1/00 (2012.01)

(56) References Cited

U.S. PATENT DOCUMENTS

| | | | | |
|---|---|---|---|---|
| 9,852,260 | B2* | 12/2017 | Guillorn | G06F 17/5081 |
| 2011/0209106 | A1* | 8/2011 | Cheng | G03F 1/38 |
| | | | | 716/55 |
| 2013/0244439 | A1* | 9/2013 | Ghariehali | H01L 21/3081 |
| | | | | 438/703 |
| 2014/0038318 | A1* | 2/2014 | Sato | B05D 1/36 |
| | | | | 438/14 |
| 2015/0143313 | A1* | 5/2015 | Robles | G06F 17/5081 |
| | | | | 716/112 |
| 2015/0143323 | A1* | 5/2015 | Robles | G06F 17/5068 |
| | | | | 716/123 |
| 2015/0227676 | A1* | 8/2015 | Robles | G06F 17/5081 |
| | | | | 716/54 |

OTHER PUBLICATIONS

T. R. Younkin, R. Gronheid, P. Rincon Delgadillo, B. T. Chan, N. Vandenbroeck, S. Demuynck, et al., "Progress in directed self-assembly hole shrink applications," SPIE 2013, pp. 86820L-86820L-11.

A. Latypov, T. H. Coskun, G. Garner, M. Preil, G. Schmid, J. Xu, Y. Zou, "Simulation of spatial DSA morphology, DSA-aware assist features and block copolymer-homopolymer blend", SPIE 2014, pp. 904908-1-904908-10.

S. Wuister, T. Druzhinina, D. Ambesi, B. Laenens, L. H. Yi, J. Finders, "Influence of Litho Patterning on DSA placement errors", SPIE 2104, pp. 904910-1 904910-13.

S. Wuister, D. Ambesi, T. Druzhinina, E. Peeters, J. Finders, J. K. Wolterink, J. G. E. M. Fraaije, "Fundamental study of placement errors in directed self-assembly", Journal of Micro/Nanolithography, MEMS, and MOEMS, v01. 13, Jul.-Sep. 2014.

Y. Ma, J. A. Torres, G. Fenger, Y Granik, J. Ryckaert, G. Vanderberghe, J. Bekaert, James Word, "Challenges and opportunities in applying grapho-epitaxy DSA lithography to metal cut and contact/via applications", EMLC 2014.

Azat Latypov, "Computational solution of inverse directed self-assembly problem Alternative Lithographic Technologies V", edited by William M. Tong, Douglas J. Resnick, Proc. of SPIE vol. 8680, 86800Z—© 2013 SPIE—CCC code: 0277-786X/13/$18—doi: 10.1117/12.2011575 10 pages.

Azat Latypov*a, Moshe Preilb, Gerard Schmidc, Ji Xuc, He Yia, Kenji Yoshimotoc,d, Yi Zoua "Exploration of the directed self-assembly based nano-fabrication design space using computational simulations Alternative Lithographic Technologies V", edited by William M. Tong, Douglas J. Resnick, Proc. of SPIE vol. 8680, 868013—© 2013 SPIE—CCC code: 0277-786X/13/$18—doi: 10.1117/12.2011238.

William Hinsberg*, Joy Cheng, Ho-Cheol Kim and Daniel P. Sanders, "Self-Assembling Materials for Lithographic Patterning: Overview, Status and Moving Forward Alternative Lithographic Technologies II", edited by Daniel J. C. Herr, Proc. of SPIE vol. 7637,76370G—© 2010 SPIE—CCC code: 0277-786X/10/$18—doi: 10.1117/12.852230 11 pages.

Chi-Chun Liu*a, Jed Piteraa, Neal Laffertyb, Kafai Laib, Charles Rettnera, Melia Tjioa, Noel Arellanoa, Joy Chenga Progress towards the integration of optical proximity correction and directed self-assembly of block copolymers with graphoepitaxy Alternative Lithographic Technologies IV, edited by William M. Tong, Douglas J. Resnick, Proc. of SPIE.

Kafai Lai1, Chi-chun Liu2, Jed Pitera3, Dan J. Dechene1, Anthony Schepis2, Jassem Abdallah2, Hsinyu Tsai4, Mike Guillom4, Joy Cheng3, Gregory Doerk3, Melia Tjio3, Charles Rettner3, Olalekan, Odesanya1, Melih Ozlem, Neal Lafferty, "Computational Aspects of Optical Lithography Extension by Directed Self-Assembly Optical Microlithography XXVI", edited by Will Conley, Proc. of SPIE vol. 8683, 868304.

* cited by examiner

Flow chart 400

GUIDING PATTERNS OPTIMIZATION FOR DIRECTED SELF-ASSEMBLY

RELATED APPLICATIONS

This application claims the benefit of U.S. Provisional Patent Application No. 62/140,363, filed on Mar. 30, 2015, entitled "Directed-Self-Assembly Guiding Pattern Optimization" and naming Junjiang Lei et al. as inventors, which application is incorporated entirely herein by reference.

FIELD OF THE DISCLOSED TECHNOLOGY

The present disclosed technology relates to directed self-assembly lithographic patterning technologies. Various implementations of the disclosed technology may be particularly useful for generating optimized guiding patterns.

BACKGROUND OF THE DISCLOSED TECHNOLOGY

Conventional lithographic imaging processes employ liquid immersion to increase the effective numerical aperture (NA) and make use of extensive resolution enhancement techniques (RET). This appears adequate to meet the lithographic needs of integrated circuits through the 32 nm generation. Starting from the 22 nm node, the numerical aperture NA has only marginally increased and the $k_1$ value is approaching the theoretical limit of 0.25. Further lithography scaling has relied mainly on double or even multiple patterning techniques. While multiple patterning techniques provide the resolution required for further scaling, the overall cost to implement multiple patterning techniques has reached a level that other techniques may need to be explored.

Directed self-assembly (DSA) has recently emerged as such a technique for lithographic patterning to reach 22 nm and below. In self-assembly, the formation of features of fine geometric dimensions occurs not through external patterning, but through the spontaneous phase behavior found among polymers on the molecular level. Of particular interest are diblock copolymers formed by chemically connecting normally incompatible species, such as poly(styrene) (PS) and poly(methyl-methacrylate) (PMMA). By creating linked chains of these materials and controlling the relative molecular weight, various structures can spontaneously form. The appeal of these structures, easily formed around 20 nm in size, is that the boundaries between the two disparate polymers can be quite uniform, with the uniformity dictated not by the noise properties of a patterning process, but by the relative molecular weight of the polymers. This is a quantity that can be precisely controlled.

One problem with these polymers is that, although local order and roughness can be quite good, small variations in the polymer chain can lead to kinks that reset the self-assembly process. Long range patterns therefore appear somewhat chaotic. The problem of long range order can be addressed by using a conventional patterning process to guide and direct the spontaneous formation of the block co-polymer structures. This "directed self-assembly" can take the form of having the self-assembly occur in grooves (grapho-epitaxy) or other geometrically confined regions or by chemically patterning a surface to create local affinities to the various portions of the block co-polymers (chemo-epitaxy).

In a grapho-epitaxy process, the main mechanism by which the block-copolymer self organizes in useful domains, is dominated by the concept of confinement. Neutral walls or pillars prevent certain chain configurations which then lead to the polymer to adjust its periodic structures along a pre-determined axis. The benefit of this technique is that the guiding pattern can be very local and there is limited interdependency between different organization domains.

A chemo-epitaxy process defines the preferred direction by a chemical brush which changes the surface energy of the substrate, by doing so and due to the different chemical affinity of the different diblock species to the substrate, the material organizes in a preferential direction minimizing the energy required to achieve a specific configuration. The benefit of this technique is the ability to pattern dense gratings or arrays as the guiding patterns are underneath the block-copolymer.

A lot of progress of DSA in getting impressive resolution has been repeatedly demonstrated using the PS-PMMA system. Some record low pitches of sub-15 nm have been observed in laboratory recently. DSA also has an advantage of not requiring new capital equipment investment and can be used complimentary with other lithographic techniques, including EUV and Direct Write Electron Beam (Ebeam). Using a grapho-epitaxy process for contact and via layers seems like a promising technique as it has the potential to reduce total mask count and remove one patterning step from the process of record while maintaining the yield. However, DSA has its own set of challenges that need to be addressed before becoming a viable alternative to current lithographic techniques.

BRIEF SUMMARY OF THE DISCLOSED TECHNOLOGY

Aspects of the disclosed technology relate to techniques of generating guiding patterns for via-type features. In one aspect, there is a method comprising: constructing an initial guiding pattern for two or more via-type features in a layout design based on target values of location and size parameters for the two or more via-type features, wherein the initial guiding pattern is characterized by a plurality of guiding pattern parameters and is for producing the two or more via-type features through directed-self-assembly (DSA); extracting predicted values of the location and size parameters for the two or more via-type features from the initial guiding pattern based on simulations or correlation information between the plurality of guiding pattern parameters and the location and size parameters for the two or more via-type features; determining a modified guiding pattern by adjusting one or more parameters of the plurality of guiding pattern parameters based on the predicted values of the location and size parameters, the target values of location and size parameters and the correlation information.

The method may further comprise: repeating the extracting by replacing the initial guiding pattern with the modified guiding pattern and the determining until one of one or more termination conditions is met.

The initial guiding pattern may be for producing two via-type features and the plurality of guiding pattern parameters may comprise longest length along line connecting the two via-type features, widest width, distance between two inflection points on two inner edges of a neck region and neck width in the middle of the initial guiding pattern or their linear combinations. The plurality of guiding pattern parameters may further comprise curvatures around corners (as indicated by circles 620 and 630 in FIG. 6) and a slope at inflection points (as indicated by line segment 640 in FIG. 6).

Figure 7:
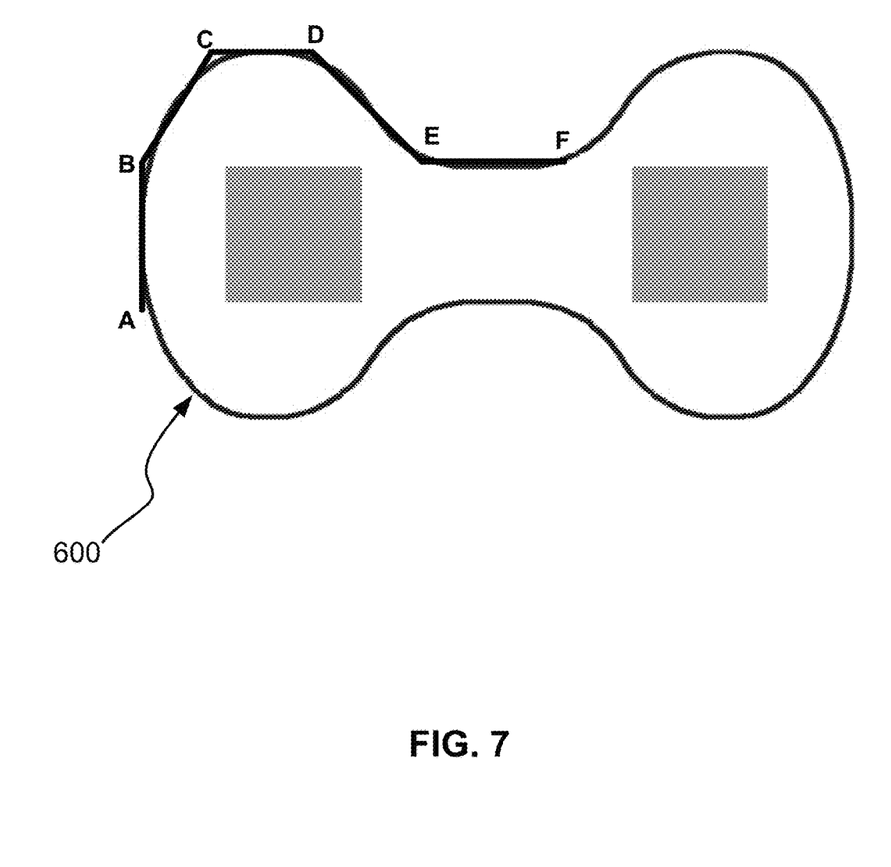
FIG. 7 illustrates another example of a set of guiding pattern parameters that may be employed according to various embodiments of the disclosed technology.

The initial guiding pattern for producing two via-type features may be represented by a polygon and the plurality of guiding pattern parameters may comprise relative coordinates of four vertices (B, C, D, and E in FIG. 7).

The correlation information may comprise a template error enhancement factor (TEEF). The simulations may be Monte-Carlo simulations.

The correlation information may be determined based on comparing the predicted values of the location and size parameters with predicted values of location and size parameters for a guiding pattern obtained by enlarging or reducing the initial guiding pattern uniformly.

In another aspect, there are one or more non-transitory computer-readable media storing computer-executable instructions for causing one or more processors to perform the above method.

In still another method, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Various aspects of the present disclosed technology relate to techniques of generating and optimizing guiding patterns for via-type features in a layout design. In the following description, numerous details are set forth for purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "construct," "extract" and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

Figure 1:
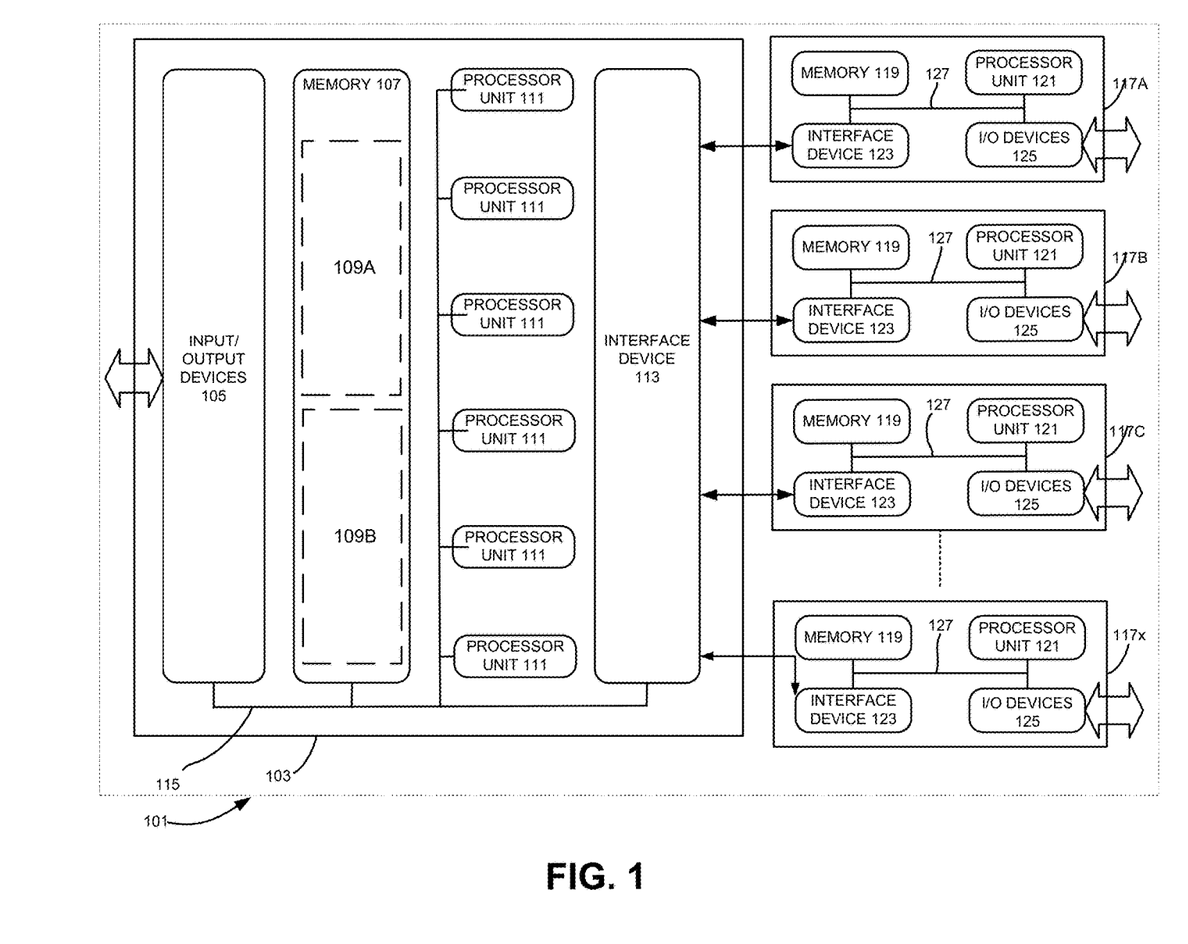
FIG. 1 illustrates an example of a computing system that may be used to implement various embodiments of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
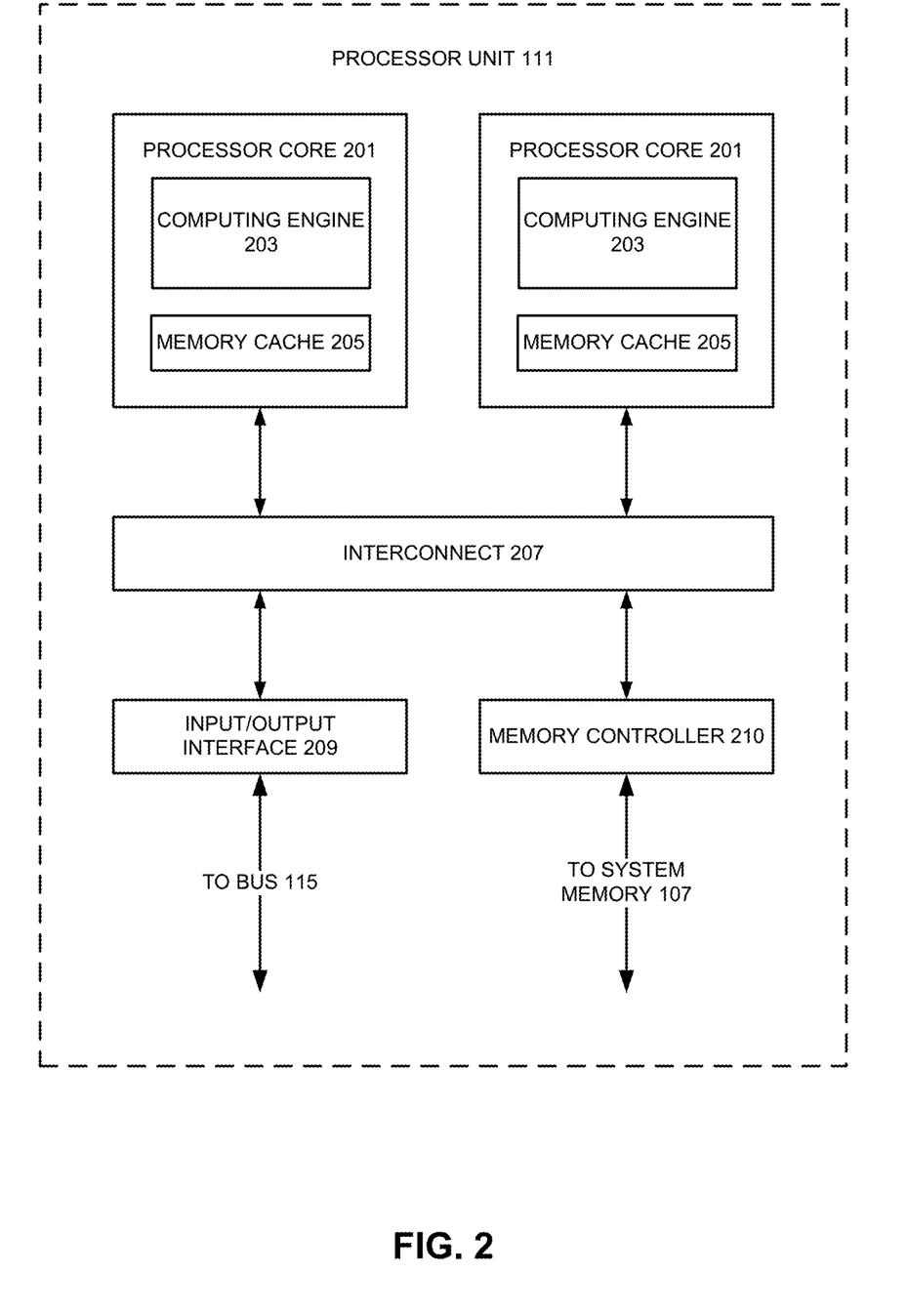
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Guiding Patterns for Directed Self-Assembly

As noted briefly in the section of Background of Disclosed Technology, self-assembly may be directed or guided in two ways: grapho-epitaxy and chemo-epitaxy. In a grapho-epitaxy process, topographical features such as photoresist or hard mask are used to guide the phase segregation. In a chemo-epitaxy process, a thin underlying pining layer is used to pin the phase segregation process. All process steps can be run inside a standard lithography track and etch tool. Directed self-assembly patterning processes may also be divided into two categories according to targeted lithographic patterns: one for line-type features and the other for via-type features. The line-type features may be patterned with chemo-epitaxy or grapho-epitaxy while the via-type features are usually patterned with grapho-epitaxy.

Patterns for directing or guiding self-assembly of certain materials e.g., block copolymers are called guiding patterns. Patterns formed on a chip after a directed self-assembly process based on guiding patterns should resemble patterns (features) desired to be "printed" (i.e., target patterns/features). In a grapho-epitaxy process employing the PS-PMMA system, for example, self-assembled PMMA patterns correspond to target patterns (target features).

A directed self-assembly process is mainly about free energy minimization and is governed by thermodynamic principles. Generating appropriate guiding patterns is important for producing features close to or matching target features. Three parameters are often used to measure how good a feature matches the target: critical dimensions along X (parallel to the interconnection line between the two features) and Y (perpendicular to the interconnection line between the two features) axes, and placement error. Sometimes, the two critical dimensions may be replaced by critical dimension along Y and hole symmetry (a function of critical dimensions along X and Y).

Given a target feature or feature constraints measured by parameters such as the above mentioned critical dimensions along X and Y and placement error parameters, a guiding pattern may be synthesized using various methods. One such method is described in a U.S. Pat. No. 9,032,357 filed by the Applicant. Another method is described in a U.S. patent application Ser. No. 14/693,304 (U.S. Publication No. 2015/0227676), also filed by the Applicant. From the synthesized guiding pattern, features produced through directed self-assembly may be predicted based on simulations, empirical data or some other methods. The predicted features may be compared with the target one to determine whether the guiding pattern is synthesized properly or not and how the guiding pattern should be adjusted.

In practice, only a few guiding pattern parameters are usually used to describe a guiding pattern. The choice of guiding pattern parameters may affect whether and how fast a good guiding pattern can be found. For example, if a guiding pattern is limited to a certain shape with a limited number of the guiding pattern parameters to be adjustable, an optimized guiding pattern may not be derived. On the other hand, if there are too many guiding pattern parameters to be adjustable, the process of searching for an optimized guiding pattern may become too long to be useful in practice.

Not only the choice of guiding pattern parameters is important, the determination of the correlation information between the guiding pattern parameters and the feature parameters can also facilitate the guiding pattern generation/optimization process. Based on the correlation information, guiding patterns not sensitive to manufacturing variations may be determined and the searching process may be accelerated, as will be discussed in detail below.

Guiding Pattern Generation Tool

Figure 3:
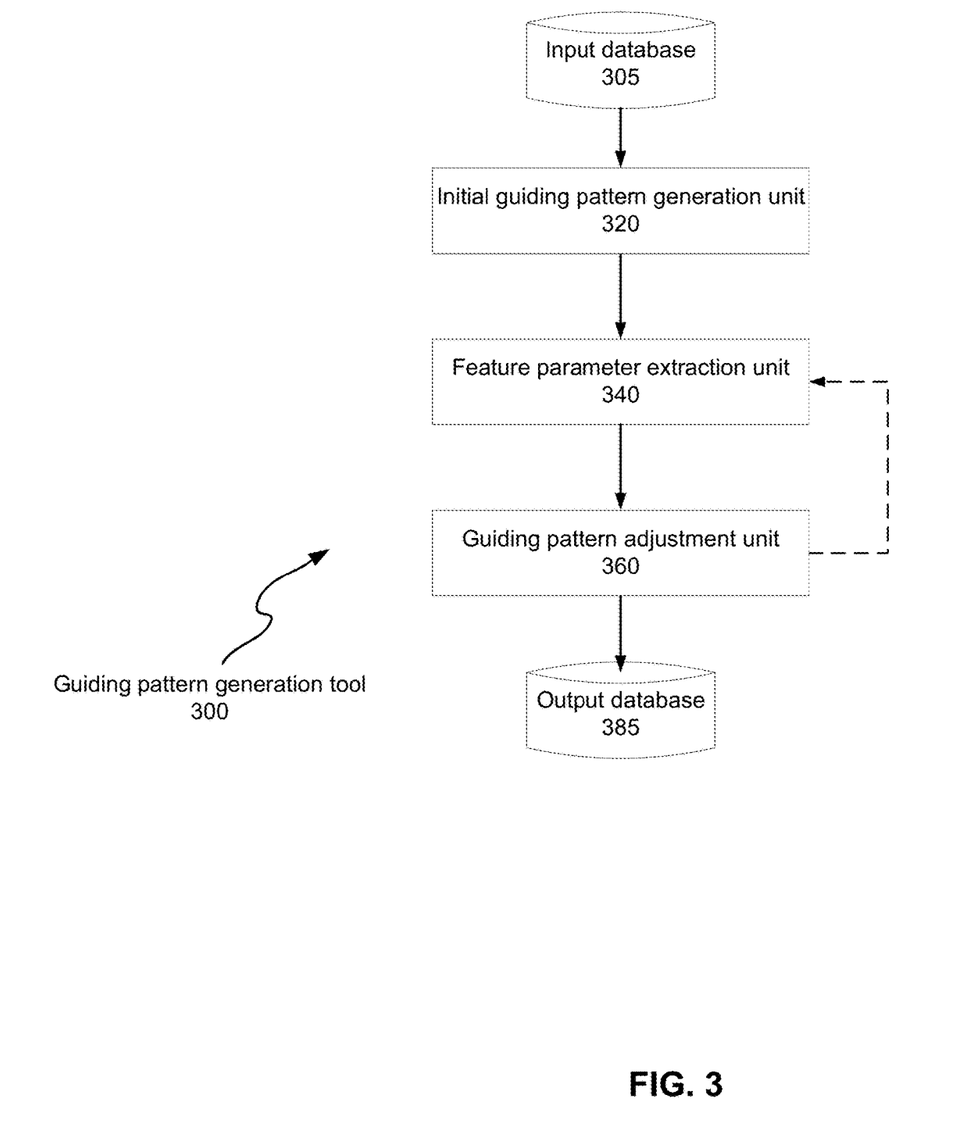
FIG. 3 illustrates an example of a guiding pattern generation tool that may be implemented according to various embodiments of the disclosed technology.

FIG. 3 illustrates an example of a guiding pattern generation tool 300 that may be implemented according to various embodiments of the disclosed technology. As seen in this figure, the guiding pattern generation tool 300 includes an initial guiding pattern generation unit 320, a feature parameter extraction unit 340 and a guiding pattern adjustment unit 360. Some implementations of the guiding pattern generation tool 300 may cooperate with (or incorporate) one or both of an input database 305 and an output database 385.

As will be discussed in more detail below, the initial guiding pattern generation unit 320 constructs an initial guiding pattern for two or more via-type features in a layout design based on targeted values of location and size parameters for the two or more via-type features. The initial guiding pattern is characterized by a plurality of guiding pattern parameters and is for producing the two or more via-type features through directed-self-assembly. The feature parameter extraction unit 340 extracts predicted values of the location and size parameters for the two or more via-type features from the initial guiding pattern based on simulations or correlation information between the plurality of guiding pattern parameters and the location and size parameters for the two or more via-type features. The guiding pattern adjustment unit 360 determines a modified guiding pattern by adjusting one or more parameters of the plurality of guiding pattern parameters based on the predicted values of the location and size parameters, the target values of location and size parameters and the correlation information.

With various implementations of the invention, the extraction and the adjustment may be repeated to form an iteration process as indicated by a dotted arrow line in the figure reconnecting the guiding pattern adjustment unit 360 back to the feature parameter extraction unit 340.

As previously noted, various examples of the disclosed technology may be implemented by one or more computing systems, such as the computing system illustrated in FIGS. 1 and 2. Accordingly, one or more of the initial guiding pattern generation unit 320, the feature parameter extraction unit 340 and the guiding pattern adjustment unit 360 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the initial guiding pattern generation unit 320, the feature parameter extraction unit 340 and the guiding pattern adjustment unit 360. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while of the initial guiding pattern generation unit 320, the feature parameter extraction unit 340 and the guiding pattern adjustment unit 360 are shown as separate units in FIG. 3, a single computer (or a single processor within a master computer) or a single computer system may be used to implement all of these units at different times, or components of these units at different times.

With various examples of the disclosed technology, the input database 305 and the output database 385 may be implemented using any suitable computer readable storage device. That is, either of the input database 305 and the output database 385 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 385 are shown as separate units in FIG. 3, a single data storage medium may be used to implement some or all of these databases.

Guiding Pattern Generation

Figure 4:
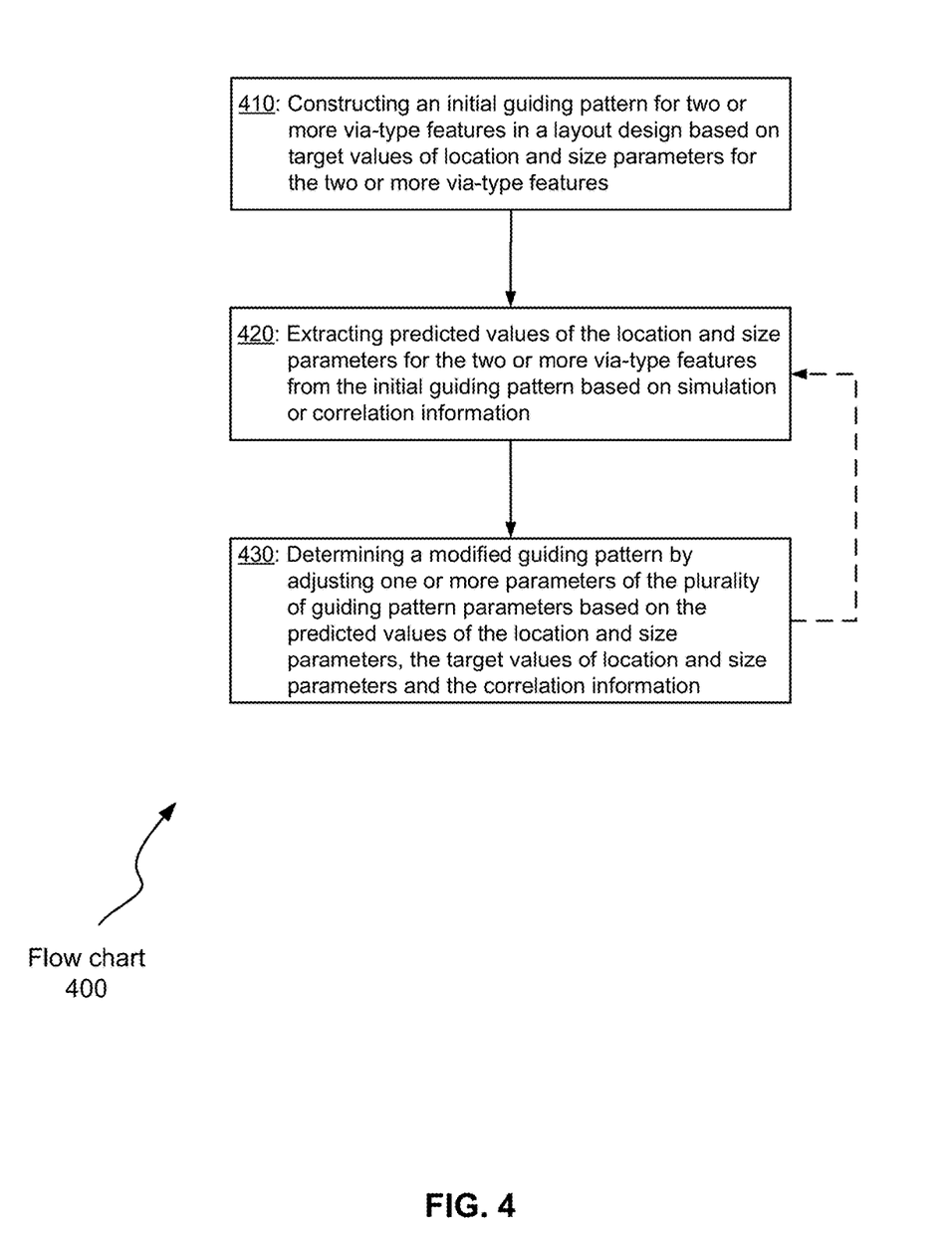
FIG. 4 illustrates an example of a flow chart describing a process of guiding pattern generation that may be employed according to various embodiments of the disclosed technology.

FIG. 4 illustrates a flowchart 400 showing a process of guiding pattern generation that may be implemented according to various examples of the disclosed technology. For ease of understanding, methods for generating guiding patterns that may be employed according to various embodiments of the disclosed technology will be described with reference to the guiding pattern generation tool 300 in FIG. 3 and the flow chart 400 illustrated in FIG. 4. It should be appreciated, however, that alternate implementations of a guiding pattern generation tool 300 may be used to perform the methods for generating guiding patterns illustrated by the flow chart 400 according to various embodiments of the disclosed technology. Likewise, the guiding pattern generation tool 300 may be employed to perform other methods for generating guiding patterns according to various embodiments of the disclosed technology.

Figure 5:
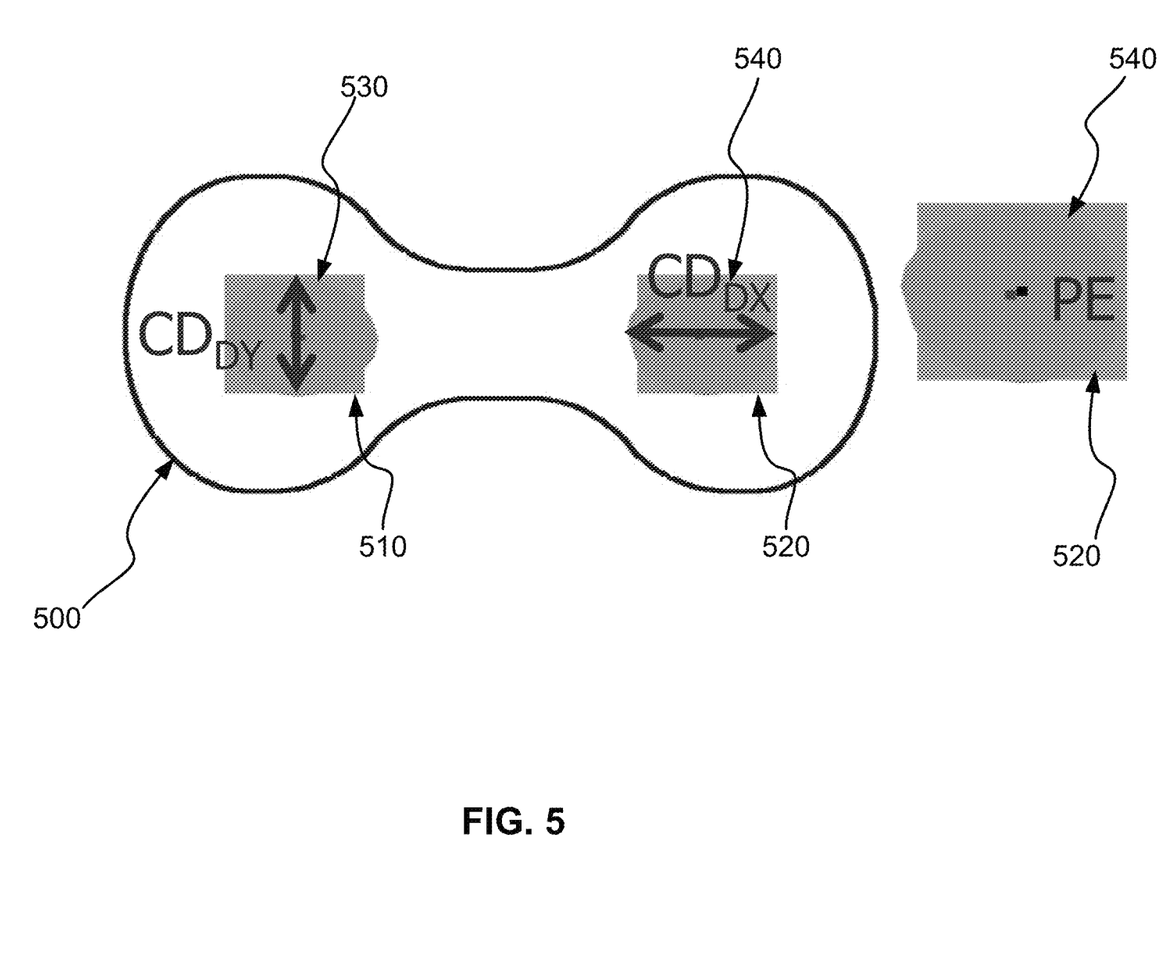
FIG. 5 illustrates an example of the location and size parameters that may be employed according to various embodiments of the disclosed technology.

In operation 410 of the flowchart 400, the initial guiding pattern generation unit 320 constructs an initial guiding pattern for two or more via-type features in a layout design based on targeted values of location and size parameters for the two or more via-type features. FIG. 5 illustrates an example of the location and size parameters that may be employed according to various embodiments of the disclosed technology. In the figure, a guiding pattern 500 for two via-type features is shown. The target via-type features are represented by two squares 510 and 520. The predicted or actually printed features are shown as two ovals 530 and 540. The location parameter is labeled as PE (placement error) and the size parameters are labeled as $CD_{DX}$ (critical dimension along the design direction) and $CD_{DY}$ (critical dimension along the direction perpendicular to the design direction). Due to symmetry of the guiding pattern, only one set of $CD_{DX}$ and $CD_{DY}$ is needed.

Figure 6:
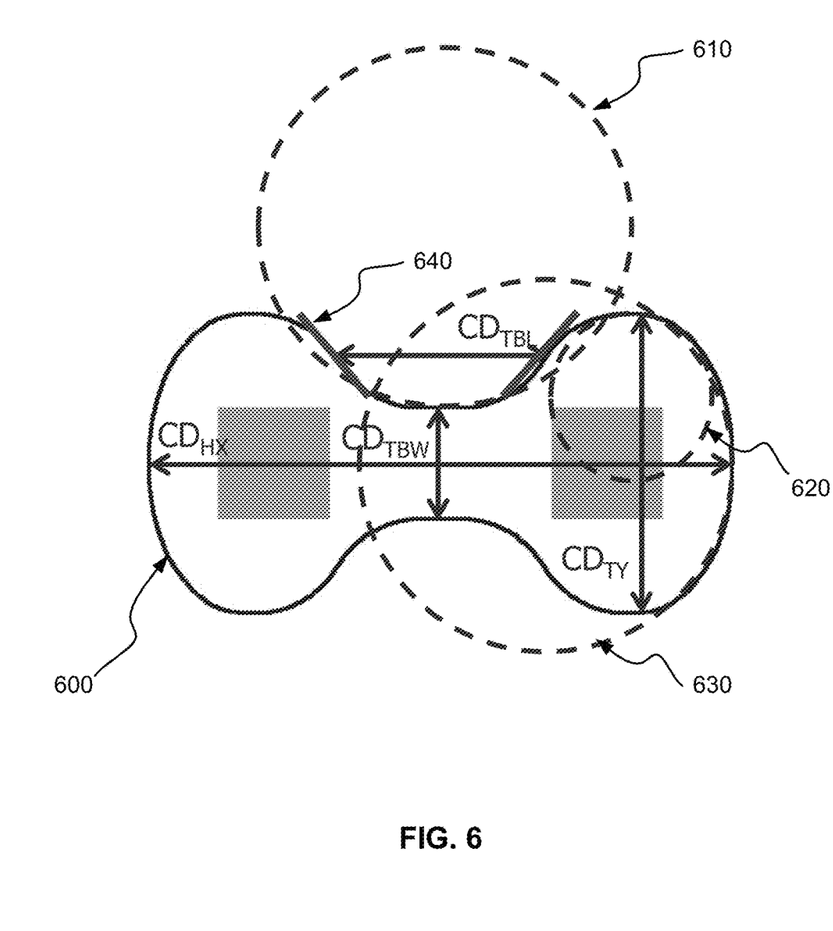
FIG. 6 illustrates an example of a set of guiding pattern parameters that may be employed according to various embodiments of the disclosed technology.

The initial guiding pattern is characterized by a plurality of guiding pattern parameters. As discussed previously, the choice of guiding pattern parameters affects whether an optimized guiding pattern can be determined quickly. FIG. 6 illustrates an example of a set of guiding pattern parameters that may be employed according to various embodiments of the disclosed technology. A guiding pattern 600 for a pair of via-type features shown in the figure has a dumbbell shape. The set of guiding pattern parameters for this guiding pattern comprises longest length $CD_{HX}$ along a line connecting the two via-type features, widest width $CD_{TY}$, distance $CD_{TBL}$ between two inflection points on two inner edges of a neck region and neck width $CD_{TBW}$ in the middle of the guiding pattern.

The set of guiding pattern parameters may further comprise curvature parameters. Three curvature parameters that may be employed according to various embodiments of the disclosed technology are represented by circles 610, 620 and 630. The circle 610 defines the curvature around the neck area and the circles 620 and 630 define the curvatures at two locations of each of the loops. Additionally or alternatively, the set of guiding pattern parameters may further comprise slope parameters. One such slope parameter may be the slope of a line segment 640 around an inflection point. The use of curvature/slope parameters allows more variations of dumbbell shapes to be produced.

FIG. 7 illustrates another example of a set of guiding pattern parameters that may be employed according to various embodiments of the disclosed technology. In the figure, the guiding pattern 600 is approximated by a polygon. Due to symmetry of the polygon, only five edges of the polygon are shown: AB, BC, CD, DE and EF. The coordinates of vertices B, C, D, and E may serve as a set of guiding pattern parameters. Here, the vertical coordinates for C and D share the same value. The number of independent guiding pattern parameters is thus seven.

Using guiding pattern parameters based on polygon vertices may benefit lithographic operations. Fabrication processes for manufacturing a circuit typically include a series of steps that deposit layers of different materials on a substrate, expose specific portions of each layer to radiation, and then etch the exposed (or non-exposed) portions of the layer away. Each time that a layer of material is exposed to radiation, a mask must be created to expose only the desired areas to the radiation, and to protect the other areas from exposure. The mask is created from circuit design layout data. That is, the geometric elements described in a design layout define the relative locations or areas of the circuit that will be exposed to radiation through the mask. In the case of directed self-assembly, the geometric elements include guiding patterns. A mask or reticle writing tool is used to create the mask based upon the design layout, after which the mask can be used in a photolithographic process. Current mask writing tools typically use electron beams that handle only simple shapes such as rectangles and trapezoids which are derived through mask data preparation. Using polygon parameters to directly represent a guiding pattern can facilitate mask data preparation.

Moreover, the use of polygon vertices-based guiding pattern parameters may aid optical proximity correction (OPC). As circuit component size continues to reduce, the diffractive effects of light often result in defects where the intended image is not accurately "printed" onto the substrate during the photolithographic process. OPC improves the resolution of the image that the mask forms on the substrate by modifying the layout design data employed to create the mask. In a conventional OPC process, the edges of the geometric elements in the design are fragmented and adjusted. By representing a guiding pattern with a polygon, the fragmentation step may be skipped and the polygon vertices-based guiding pattern parameters may be directly adjusted in the OPC process.

FIGS. 6 and 7 are just examples of guiding pattern parameters. The plurality of guiding pattern parameters may comprise parameters that are combination of the ones shown in the figures. Parameters not related to those shown in FIGS. 6 and 7 may also be adopted. With some implementations of the disclosed technology, the number of the plurality of guiding pattern parameters is at least six. The initial guiding pattern generation unit 320 may construct the initial guiding pattern by setting initial values of the plurality of guiding pattern parameters according to the targeted values of the location and size parameters based on previous experience or estimation.

Figure 8:
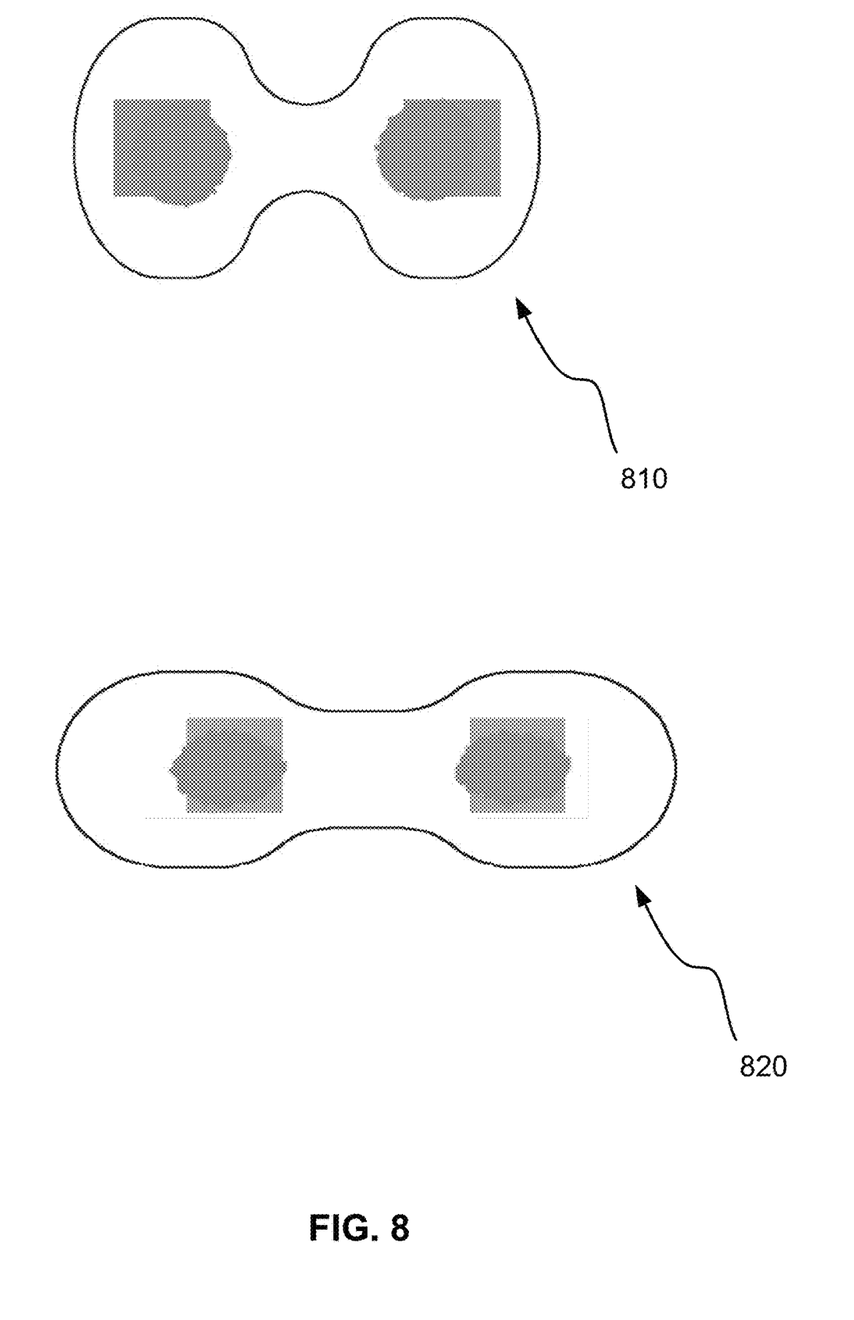
FIG. 8 illustrates two examples of DSA patterning errors due to defective guiding patterns which are predicted by Monte-Carlo simulations.

In operation 420 of the flowchart 400, the feature parameter extraction unit 340 extracts predicted values of the location and size parameters for the two or more via-type features from the initial guiding pattern based on simulations or correlation information between the plurality of guiding pattern parameters and the location and size parameters for the two or more via-type features. Monte-Carlo simulations have been applied to self-assembly processes for many years. FIG. 8 illustrates two examples (810 and 820) of DSA patterning errors predicted by Monte-Carlo simulations on guiding patterns. Similar to FIG. 5, square shapes represent target via-type features and oval shapes represent simulated via-type features. The example 810 illustrates a placement error (location error): the simulated features are too closer to each other than targeted. The example 820 illustrates critical dimension errors (size errors) 720: the vertical critical dimension of the simulated features is too small than targeted while the horizontal critical dimension is a bit too large.

Alternatively or additionally, the correlation information may be used to extract the predicted values of the location and size parameters for the two or more via-type features. The correlation information may be determined by conducting a directed self-assemble process using chips printed with guiding patterns having various guiding pattern parameter values. The correlation information may also be determined based on simulations such as Monte-Carlo simulations. Another approach is to compare the predicted values of the location and size parameters for the initial guiding pattern with predicted values of location and size parameters for a guiding pattern obtained by enlarging or reducing the initial guiding pattern uniformly.

Figure 9:
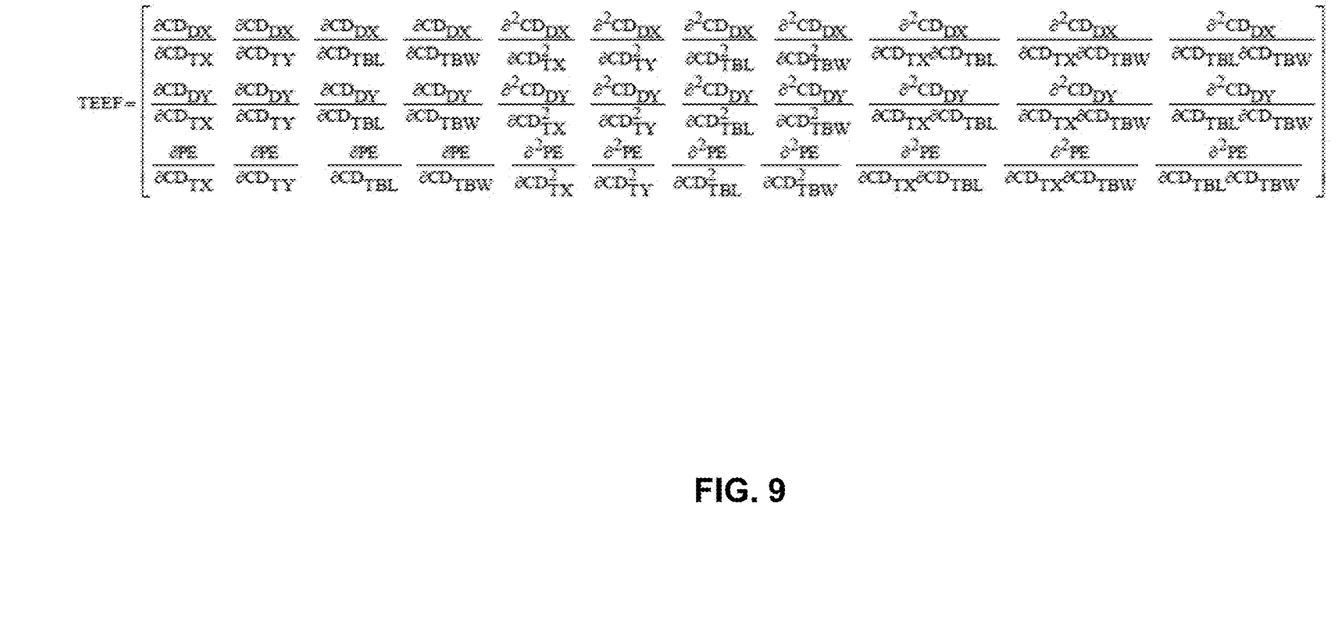
FIG. 9 illustrates an example of the template error enhancement factor (TEEF).

The correlation information may comprise a template error enhancement factor (TEEF) describing the relationship between changes in guiding pattern parameters and corresponding changes in feature critical dimension errors/placement errors. The template error enhancement factor (TEEF) may be represented by a matrix that includes only linear terms or both linear and non-linear terms. The guiding pattern parameters used in the TEEF may be a subset of the plurality of guiding pattern parameters. FIG. 9 illustrates an example of the TEEF. The guiding pattern parameters used in the TEEF are $CD_{TX}$, $CD_{TY}$, $CD_{TBL}$, and $CD_{TBW}$. The last three are shown in FIG. 6, and $CD_{TX}$ is a function of $CD_{TBL}$, and $CD_{HX}$:

$$CD_{TX} = \frac{CD_{HX} - CD_{TBL}}{2} \quad (1)$$

The location and size parameters used in the TEEF are $CD_{DX}$, $CD_{DY}$, and PE illustrated in FIG. 5.

Figure 10:
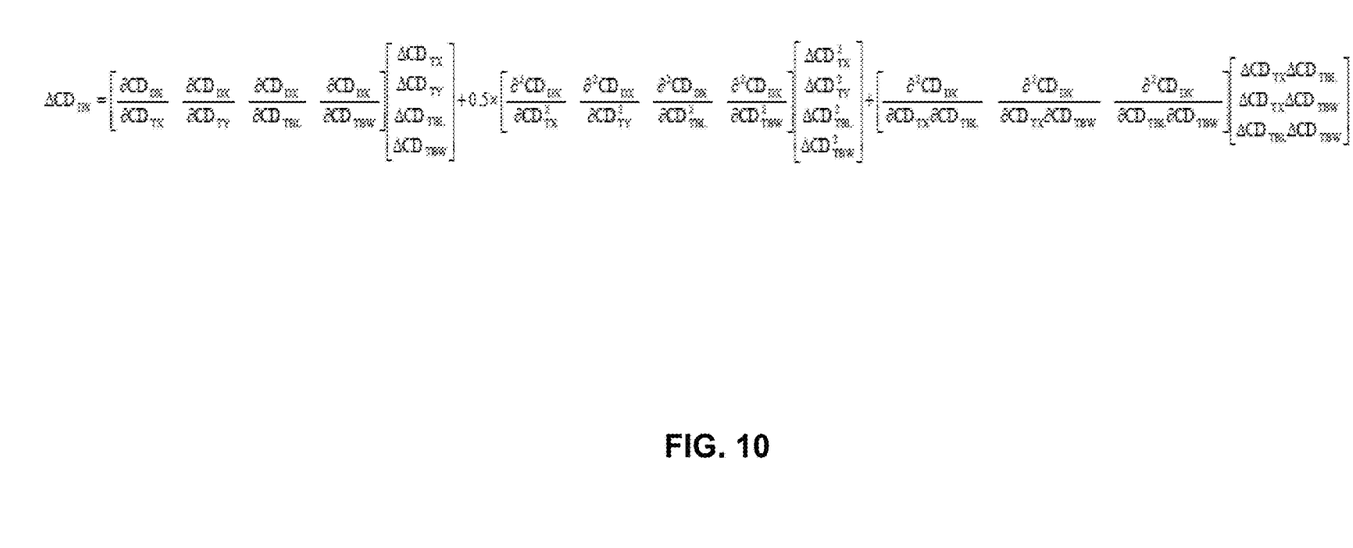
FIG. 10 illustrates an equation for calculating a critical dimension error based on changes on the guiding pattern parameters that may be implemented according to various embodiments of the disclosed technology.

Because the TEEF describes the relation between changes on the guiding pattern parameters and changes on DSA patterning results, changes of location and size may be predicted from the changes of guiding pattern parameters. This is particularly useful during iterations which will be discussed later. For example, $\Delta CD_{DX}$, which is the $CD_{DX}$ deviation, may be calculated as shown in FIG. 10.

In operation 430 of the flowchart 400, the guiding pattern adjustment unit 360 determines a modified guiding pattern by adjusting one or more parameters of the plurality of guiding pattern parameters based on the predicted values of the location and size parameters, the target values of location and size parameters and the correlation information. The differences between the predicted values and the target values offer hints on how the plurality of guiding pattern parameters should be adjusted. In the two examples illustrated in FIG. 8, the placement error of the example 810 indicates that $CD_{TX}$ and $CD_{TBL}$ (or $CD_{HX}$ and $CD_{TBL}$) may need to be increased and the critical dimension errors of the example 820 indicates that at least $CD_{TY}$ may need to be adjusted.

For a given via-type feature design target, however, there is usually a guiding pattern design zone. That is, different combinations of the guiding pattern parameter values can yield similar DSA patterning results. Thus, the adjustment of the guiding pattern parameters that may be made based on the predicted values of the location and size parameters and the target values of location and size parameters may not be unique. The guiding pattern adjustment unit 360 may employ the correlation information to determine a modified guiding pattern that has a low sensitivity of DSA printing infidelity to guiding pattern printing infidelity. To accomplish it, for example, the norm of the TEEF matrix may be set as an objective function. The modified guiding pattern will be the one that has the smallest objective function value.

Before considering the sensitivity, the guiding pattern adjustment unit 360 may first filter out use the guiding patterns with significant patterning challenges. One of the patterning challenges may be that it is difficult to print a guiding pattern with a small $CD_{TBW}$ due to the resolution limit of 193 nm lithography. The guiding pattern adjustment unit 360 may, for example, set a lower limit for $CD_{TBW}$.

To generate an optimized guiding pattern, the guiding pattern generation tool 300 may repeat the operation 420 by replacing the initial guiding pattern with the modified guiding pattern and the operation 430 as indicated by the dotted arrow line in FIG. 4. This iteration process may continue until one of one or more termination conditions is met. One of the one or more termination conditions may be that the placement and critical dimension errors are within prescribed ranges. Another termination condition may be predetermined maximum number of iterations.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. One or more non-transitory computer-readable media storing computer-executable instructions that, when executed cause one or more processors to:
   construct an initial guiding pattern for two or more via-type features in a layout design based on target values of location and size parameters for the two or more via-type features, wherein the initial guiding pattern is characterized by a plurality of guiding pattern parameters and is for producing the two or more via-type features through directed-self-assembly (DSA);
   extract predicted values of the location and size parameters for the two or more via-type features from the initial guiding pattern based on simulations or correlation information between the plurality of guiding pattern parameters and the location and size parameters for the two or more via-type features;
   determine a modified guiding pattern by adjusting one or more parameters of the plurality of guiding pattern parameters based on the predicted values of the location and size parameters, the target values of location and size parameters and the correlation information; and
   store the modified guiding pattern in an output database, wherein the modified guiding pattern is thereafter used in a chemo-epitaxy manufacturing process or a grapho-epitaxy manufacturing process.

2. The one or more non-transitory computer-readable media recited in claim 1, wherein the method further comprises:
   repeating the extracting by replacing the initial guiding pattern with the modified guiding pattern and the determining until one of one or more termination conditions is met.

3. The one or more non-transitory computer-readable media recited in claim 1, wherein the initial guiding pattern is for producing two via-type features and the plurality of guiding pattern parameters comprise longest length along line connecting the two via-type features, widest width, distance between two inflection points on two inner edges of a neck region and neck width in the middle of the initial guiding pattern or their linear combinations.

4. The one or more non-transitory computer-readable media recited in claim 3, wherein the plurality of guiding pattern parameters further comprises curvatures around corners and a slope at inflection points.

5. The one or more non-transitory computer-readable media recited in claim 1, wherein the initial guiding pattern is for producing two via-type features and is represented by a polygon and the plurality of guiding pattern parameters comprise relative coordinates of four vertices.

6. The one or more non-transitory computer-readable media recited in claim 1, wherein the simulations are Monte-Carlo simulations.

7. The one or more non-transitory computer-readable media recited in claim 1, wherein the correlation information is determined based on comparing the predicted values of the location and size parameters with predicted values of location and size parameters for a guiding pattern obtained by enlarging or reducing the initial guiding pattern uniformly.

8. The one or more non-transitory computer-readable media recited in claim 1, wherein the correlation information comprises a template error enhancement factor (TEEF).

9. A method, executed by at least one processor of a computer, comprising:
constructing an initial guiding pattern for two or more via-type features in a layout design, by the at least one processor, based on target values of location and size parameters for the two or more via-type features, wherein the initial guiding pattern is characterized by a plurality of guiding pattern parameters and is for producing the two or more via-type features through directed-self-assembly (DSA);
extracting predicted values of the location and size parameters for the two or more via-type features, by the at least one processor, from the initial guiding pattern based on simulations or correlation information between the plurality of guiding pattern parameters and the location and size parameters for the two or more via-type features;
determining a modified guiding pattern by adjusting one or more parameters of the plurality of guiding pattern parameters, by the at least one processor, based on the predicted values of the location and size parameters, the target values of location and size parameters and the correlation information; and
storing the modified guiding pattern in an output database by the at least one processor, wherein the modified guiding pattern is thereafter used in a chemo-epitaxy manufacturing process or a grapho-epitaxy manufacturing process.

10. The method recited in claim 9, further comprising:
repeating the extracting by replacing the initial guiding pattern with the modified guiding pattern and the determining until one of one or more termination conditions is met.

11. The method recited in claim 9, wherein the initial guiding pattern is for producing two via-type features and the plurality of guiding pattern parameters comprise longest length along line connecting the two via-type features, widest width, distance between two inflection points on two inner edges of a neck region and neck width in the middle of the initial guiding pattern or their linear combinations.

12. The method recited in claim 11, wherein the plurality of guiding pattern parameters further comprises curvatures around corners and a slope at inflection points.

13. The method recited in claim 9, wherein the initial guiding pattern is for producing two via-type features and is represented by a polygon and the plurality of guiding pattern parameters comprise relative coordinates of four vertices.

14. The method recited in claim 9, wherein the simulations are Monte-Carlo simulations.

15. The method recited in claim 9, wherein the correlation information is determined based on comparing the predicted values of the location and size parameters with predicted values of location and size parameters for a guiding pattern obtained by enlarging or reducing the initial guiding pattern uniformly.

16. The method recited in claim 9, wherein the correlation information comprises a template error enhancement factor (TEEF).

17. A system comprising:
one or more processors, the one or more processors programmed to perform a method, the method comprising:
constructing an initial guiding pattern for two or more via-type features in a layout design, by the one or more processors, based on target values of location and size parameters for the two or more via-type features, wherein the initial guiding pattern is characterized by a plurality of guiding pattern parameters and is for producing the two or more via-type features through directed-self-assembly (DSA);
extracting predicted values of the location and size parameters for the two or more via-type features from the initial guiding pattern, by the one or more processors, based on simulations or correlation information between the plurality of guiding pattern parameters and the location and size parameters for the two or more via-type features;
determining a modified guiding pattern by adjusting one or more parameters of the plurality of guiding pattern parameters, by the one or more processors, based on the predicted values of the location and size parameters, the target values of location and size parameters and the correlation information; and
storing the modified guiding pattern in an output database by the one or more processors, wherein the modified guiding pattern is thereafter used in a chemo-epitaxy manufacturing process or a grapho-epitaxy manufacturing process.

18. The system recited in claim 17, wherein the method further comprises:
repeating the extracting by replacing the initial guiding pattern with the modified guiding pattern and the determining until one of one or more termination conditions is met.

19. The system recited in claim 17, wherein the initial guiding pattern is for producing two via-type features and the plurality of guiding pattern parameters comprise longest length along line connecting the two via-type features, widest width, distance between two inflection points on two inner edges of a neck region and neck width in the middle of the initial guiding pattern or their linear combinations.

20. The system recited in claim 17, wherein the initial guiding pattern is for producing two via-type features and is represented by a polygon and the plurality of guiding pattern parameters comprise relative coordinates of four vertices.

* * * * *